US008938281B2

(12) United States Patent  
Fuderer et al.

(10) Patent No.: US 8,938,281 B2
(45) Date of Patent: Jan. 20, 2015

(54) MR IMAGING USING MULTI-CHANNEL RF EXCITATION

(75) Inventors: Miha Fuderer, Eindhoven (NL); Thomas Hendrik Rozijn, Eindhoven (NL); Ulrich Katscher, Norderstedt (DE); Kay Nehrke, Ammersbek (DE); Paul Royston Harvey, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 255 days.

(21) Appl. No.: 13/496,085

(22) PCT Filed: Sep. 27, 2010

(86) PCT No.: PCT/IB2010/054339
§ 371 (c)(1),
(2), (4) Date: Mar. 14, 2012

(87) PCT Pub. No.: WO2011/039692
PCT Pub. Date: Apr. 7, 2011

(65) Prior Publication Data
US 2012/0179023 A1 Jul. 12, 2012

(30) Foreign Application Priority Data

Oct. 2, 2009 (EP) ..................................... 09012508

(51) Int. Cl.
*A61B 5/05* (2006.01)
*G01R 33/561* (2006.01)
*G01R 33/565* (2006.01)

(52) U.S. Cl.
CPC ........ *G01R 33/5612* (2013.01); *G01R 33/5659* (2013.01)
USPC .......................................... 600/410; 600/407

(58) Field of Classification Search
USPC ........... 600/407, 409, 410; 324/306–309, 318
See application file for complete search history.

(56) References Cited

U.S. PATENT DOCUMENTS 4,770,182 A * 9/1988 Damadian et al. ............. 600/410
6,230,039 B1 * 5/2001 Stuber et al. .................. 600/410
(Continued)

FOREIGN PATENT DOCUMENTS

WO 02095435 A1 11/2002
WO 2005022184 A1 3/2005

OTHER PUBLICATIONS

Adriany, G., et al.; Transmit and Receive Transmission Line Arrays for 7 Tesla Parallel Imaging; 2005; MRM; 53:434-445.
(Continued)

*Primary Examiner* — Tse Chen
*Assistant Examiner* — Joel F Brutus

(57) ABSTRACT

The invention relates to a magnetic resonance imaging apparatus including an array of two or more RF antennas for transmitting RF pulses to and receiving MR signals from a subject positioned in an examination volume, and where the RF antennas have spatial transmit and receive sensitivity profiles. The apparatus is configured to control the temporal succession, the phase, and the amplitude of the RF feeding of each individual RF antenna. The apparatus is also configured to determine the phases and amplitudes from the spatial transmit sensitivity profiles of the RF antennas, and reconstruct a MR image from a combination of the received MR signals received via the individual RF antennas and from the spatial receive sensitivity profiles of the RF antennas. Further, the apparatus is configured to determine the spatial transmit sensitivity profiles of the RF antennas from the spatial receive sensitivity profiles of the RF antennas, or vice versa.

13 Claims, 2 Drawing Sheets

(56) References Cited

U.S. PATENT DOCUMENTS

Figure 1:
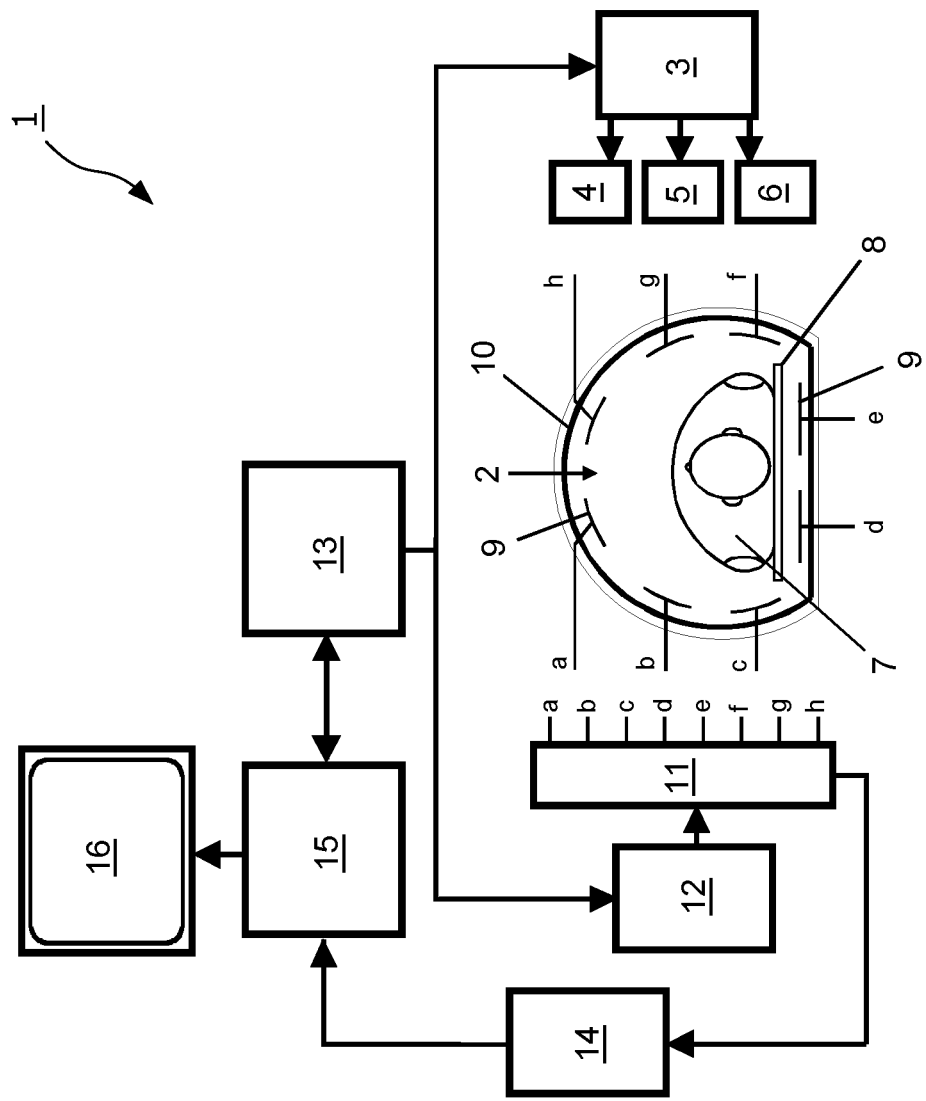

| | | | |
|---|---|---|---|
| 6,559,642 | B2 | 5/2003 | King |
| 7,279,901 | B2 | 10/2007 | Diehl et al. |
| 7,288,937 | B2 | 10/2007 | Nabetani |
| 7,330,575 | B2 | 2/2008 | Fuderer |
| 7,375,523 | B1* | 5/2008 | Hancu .................. 324/307 |
| 2002/0039024 | A1* | 4/2002 | Fuderer et al. ........... 324/307 |
| 2005/0110487 | A1 | 5/2005 | Zhu |
| 2005/0140369 | A1* | 6/2005 | Feiweier et al. ......... 324/318 |
| 2006/0261809 | A1* | 11/2006 | Fuderer et al. ........... 324/309 |
| 2008/0100292 | A1 | 5/2008 | Hancu |
| 2008/0129298 | A1* | 6/2008 | Vaughan et al. .......... 324/322 |
| 2008/0231273 | A1 | 9/2008 | Kabasawa |
| 2008/0265889 | A1 | 10/2008 | Zhai et al. |
| 2008/0278161 | A1 | 11/2008 | Griswold et al. |

OTHER PUBLICATIONS

Ballester, M.A.G., et al.; Robust Estimation of Coil Sensitivities for RF Subencoding Acquisition Techniques; 2001; Proc. Intl. Soc. Mag. Reson. Med.; 9:799.

Collins, C. M., et al.; Different Excitation and Reception Distributions with a Single-Loop Transmit-Receive Surface Coil Near a Head-Sized Spherical Phantom at 300 MHz; 2002; MRM; 47:1026-1028.

Harvey, P. R., et al.; MultiTransmit parallel RF transmission technology; 2009; URL:http://www.healthcare.philips.com/au_en/products/mri/education/brochures/MultiTransmit.pdf retrieved on May 6, 2011.

Li, B.K., et al.; Transmitting Focused B1 field and Sense Reconstruction using an 8-element Transceive Torso Phased Array Coil; 2004; Proc. Intl. Conf. IEEE EMBS; vol. 3:1068-1072.

Setsompop, K., et al.; Slice-Selective RF Pulses for In Vivo B+1 Inhomogeneity Mitigation at 7 Tesla Using Parallel RF Excitation with a 16-Element Coil; 2008; MRM; 60:1422-1432.

Stollberger, R., et al.; Determination of spin density using measured B1 fields; 1992; Book of Abstracts, vol. 1; Soc. MRM; pp. 1315.

Von Morze, C., et al.; Exchange of surface coil antenna patterns due to gyrotropism; 2008; Proc. Intl. Soc. Mag. Reson. Med.; 16:1187.

Wang, J., et al.; Polarization of the RF Field in a Human Head at High Field: A Study with a Quadrature Surface Coil at 7.0 T; 2002; MRM; 48:362-369.

Yarnykh, V. L.; Actual Flip-Angle Imaging in the Pulsed Steady State: A Method for Rapid Three-Dimensional Mapping of the Transmitted Radiofrequency Field; 2007; MRM; 57:192-200.

* cited by examiner

MR IMAGING USING MULTI-CHANNEL RF EXCITATION

The present invention relates to the field of magnetic resonance (MR). It concerns a MR imaging apparatus comprising an array of two or more RF antennas for transmitting RF pulses to and receiving MR signals from a body of a patient positioned in an examination volume, wherein the phases and the amplitudes of the RF feeding of the RF antennas are controlled, for example for the purpose of RF shimming.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field extends perpendicular to the z-axis (also referred to as longitudinal axis), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z direction relaxes with a second time constant T2 (spin-spin or transverse relaxation time). The variation of the magnetization can be detected by means of receiving RF antennas which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving RF antennas.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

In MR imaging applications at high main magnetic field strengths (3 Tesla or more), an array of two or more RF antennas for transmitting RF pulses to and receiving MR signals from the examined body offers several advantages. MR imaging at a high main magnetic field strength generally suffers from inhomogeneities of the transmitted RF field ($B_1$ field). An array of RF antennas, wherein a separate transmission channel is associated with each RF antenna, can be used to improve the homogeneity of the $B_1$ field (so-called RF shimming). This is achieved by controlling the phases and the amplitudes of the RF feeding via the individual transmit channels when transmitting the RF pulses. The control of the phases and the amplitudes of the RF feeding is also useful for other applications, such as the so-called transmit-SENSE technique.

WO 02/095435 A1 discloses an array of RF antennas for a MR apparatus. The array includes a number of individual RF antennas that can be actuated individually, namely both for the receive mode and the transmit mode. In such a MR apparatus, it is advantageously possible for the RF field distribution in the examination volume to be fully controllable when generating the RF pulses by individually setting amplitude and phase within the individual RF antennas. By means of the software of the MR apparatus, the RF field distribution within the examination volume can be controlled directly and interactively. With the known MR apparatus it is conceivable to integrate fully automatic control of spatial distribution of the transmitted RF field into the respective imaging sequence in order to compensate for variable influences on the RF field distribution, for example on account of the individual dielectric properties of the body of the examined patient.

To be able to determine the amplitudes and phases for RF feeding of the individual RF antennas, the spatial transmit sensitivity profiles (also referred to as $B_1$-maps) of the individual RF antennas must be known. There are several approaches known in the art for determination of the transmit sensitivity profiles, like, for example, the dual-TR technique proposed by Yarnykh et al. (Magnetic Resonance in Medicine, 57:192-200, 2007). Such methods are also referred to as $B_1$-mapping.

A drawback of the known $B_1$-mapping methods is that they tend to be time-consuming. In practice, the measurements necessary for determination of the individual $B_1$-maps take about one minute per RF antenna. For the purpose of RF shimming, for example, the transmit sensitivity profiles have to be determined in advance, i.e. before the actual diagnostic imaging session is commenced. For the determination of the transmit sensitivity profiles corresponding $B_1$-mapping measurements have to be performed sequentially for each RF antenna. Thus, the resulting total length of the pre-scan for $B_1$-mapping is typically on the order of several minutes, which is significantly too much for clinical applications.

From the foregoing it is readily appreciated that there is a need for an improved MR imaging apparatus. It is consequently an object of the invention to provide a MR apparatus which enables a significantly reduced duration of the pre-scan for $B_1$-mapping.

In accordance with the invention, a magnetic resonance imaging apparatus comprising an array of two or more RF antennas for transmitting RF pulses to and receiving MR signals from a body of a patient positioned in an examination volume is disclosed. The RF antennas have spatial transmit and receive sensitivity profiles. The apparatus is arranged to:

control the temporal succession, the phase, and the amplitude of the RF feeding of each individual RF antenna, the phases and amplitudes being determined from the spatial transmit sensitivity profiles of the RF antennas, and reconstruct a MR image from a combination of the received MR signals received via the individual RF antennas and from the spatial receive sensitivity profiles of the RF antennas, wherein the apparatus is further arranged to:

determine the spatial transmit sensitivity profiles of the RF antennas from the spatial receive sensitivity profiles of the RF antennas, or determine the spatial receive sensitivity profiles of the RF antennas from the spatial transmit sensitivity profiles of the RF antennas.

An array of RF antennas is used for transmitting the RF pulses as well as for receiving the MR signals in accordance with the invention. As explained above, the spatial transmit sensitivity profiles have to be known for the purpose of RF shimming.

Since the same RF antenna array is used for receiving the MR signals, also the receive sensitivity profiles of the individual RF antennas have to be known for MR image reconstruction. Similar to the amplitudes and phases applied to the transmit channels for RF feeding, corresponding weighting factors (again amplitudes and phases) are applied during MR image reconstruction for combining the MR signals received via the individual RF antennas. These weighting factors compensate for the spatial inhomogeneity of the sensitivity of the individual RF antennas. To be able to determine the weighting factors, the spatial receive sensitivity profiles of the RF antennas have to be known.

The spatial receive sensitivity profiles of the RF antennas can be determined collectively within a single mapping scan. In the mapping scan, mapping MR signals are acquired allowing to derive the receive sensitivity profiles of the RF antennas. Such a mapping scan is routinely applied, for example, as a pre-scan in SENSE imaging for the purpose of determination of the spatial receive sensitivity profiles of the RF antennas. Since the spatial receive sensitivity profiles of all RF antennas can be determined collectively by means of only a single mapping scan, the time required for determination of the receive sensitivity profiles is significantly shorter than the time required to determine the transmit sensitivity profiles.

In general, the receive sensitivity profiles of the RF antennas are not equal to their respective transmit sensitivity profiles. However, it is an insight of the invention that the receive sensitivity profiles can be used for the determination of the transmit sensitivity profiles.

As an approximation, the spatial transmit and receive sensitivity profiles can be equated. This means that the (known) spatial receive sensitivity profiles are used to derive the amplitudes and phases for RF shimming. In this way, a sufficiently homogeneous RF field is obtained during RF transmission, wherein the amplitudes and phases, i.e. the shim parameters for RF feeding are obtained from a short pre-scan. The determination of the individual receive sensitivity profiles can be performed simultaneously for the complete array of RF antennas by means of an appropriate pre-scan, and, consequently, the time necessary for $B_1$-mapping in accordance with the invention is no longer proportional to the number of RF antennas.

On the other hand, it has to be taken into account that in practice it is often very difficult to reliably determine the receive sensitivity profiles of the RF antennas by means of a corresponding pre-scan. According to the invention, it is possible to determine the spatial receive sensitivity profiles of the RF antennas from the (known) spatial transmit sensitivity profiles of the RF antennas. The spatial transmit sensitivity profiles can be determined reliably and precisely, for example by the method proposed by Yarnykh et al. (see above). The weighting factors used for combination of the MR signals received via the individual RF antennas during MR imaging reconstruction can be derived from the $B_1$-maps of the RF antennas in accordance with the invention. These $B_1$-maps can be determined by means of a corresponding mapping scan, whereby a set of mapping signals is acquired allowing to derive the spatial transmit sensitivity profiles of the RF antennas.

From theory it follows that the spatial receive sensitivity profile of a RF antenna is not necessarily equal to its transmit sensitivity profile. But it can be shown that for a symmetrical setup, wherein the RF antennas are symmetrically arranged with respect to an axis or plane of symmetry, so that a mirror image RF antenna can be attributed to each RF antenna of the array, the spatial transmit sensitivity profile of a RF antenna is equal to the receive sensitivity profile of the respective mirror image RF antenna. This insight is made use of according to the invention. The invention proposes either to determine the spatial transmit sensitivity profiles of at least one RF antenna from the spatial receive sensitivity profiles of the respective mirror image RF antenna or to determine the spatial receive sensitivity profile of at least one RF antenna from the spatial transmit sensitivity profile of the respective mirror image RF antenna. Preferably, the body of the examined patient is essentially symmetric with respect to the axis or plane of symmetry of the array of RF antennas (for example the midsagittal plane may constitute a plane of symmetry within the meaning of the invention). When the RF antennas are placed in a symmetrical arrangement around the body of the patient, the spatial transmit sensitivity profiles can be derived from the respective mirror image spatial receive sensitivity profiles and vice versa, as explained above.

Furthermore, a magnetic resonance imaging apparatus comprising an array of two or more RF antennas for transmitting RF pulses to and receiving MR signals from a body of a patient is disclosed. The RF antennas have spatial transmit and receive sensitivity profiles. The apparatus is arranged to control the temporal succession, the phase and the amplitude of the RF feeding of each individual RF antenna. Moreover, the apparatus is arranged to perform the following steps:

a) subjecting the body to an absolute field mapping sequence comprising RF pulses that are generated by using a first set of phases and amplitudes of the RF feeding of the RF antennas, b) acquiring MR signals, from which the spatial distribution of the RF field transmitted during the absolute field mapping sequence is derived, c) subjecting the body to a relative field mapping sequence comprising RF pulses that are generated by using a second set of phases and amplitudes of the RF feeding of the RF antennas, d) acquiring MR signals, from which a relative map of the spatial distribution of the RF field transmitted during the relative field mapping sequence is derived, e) determine the spatial transmit sensitivity profile of at least one individual RF antenna from the spatial RF field distribution determined in step b) and from the relative map derived in step d).

According to this aspect of the invention, a full (absolute) $B_1$-mapping step is performed initially, wherein a first set of phases and amplitudes of the RF feeding of the RF antennas is applied (steps a and b). The dual-TR approach proposed by Yarnykh et al. (see above) can be used for this purpose. Knowing the absolute $B_1$-map for the first set of phases and amplitudes of the RF feeding, one or more relative $B_1$-maps are determined in steps c and d, for example by means of an imaging sequence, which then constitutes a relative field mapping sequence within the meaning of the invention. Therein a second set of phases and amplitudes of the RF feeding is applied, which phases and amplitudes will in general be different from the phases and amplitudes of the first set. Preferably, a fast three-dimensional field-echo imaging sequence is used in step c with a low flip-angle (<5°) and a very short repetition time (<10 ms). The small flip-angle makes sure that the local image intensity of the reconstructed MR image (the relative map of the spatial distribution of the RF field transmitted during the relative field mapping sequence) directly reflects the RF field strength at the respective location within the examination volume. In step e, the spatial transmit sensitivity profiles, i.e. the absolute $B_1$-maps of the RF antennas are determined from a combination of the $B_1$-map obtained by means of the absolute mapping sequence in steps a and b with the MR images, i.e. the relative $B_1$-maps obtained in steps c and d.

A full $B_1$-mapping scan has to be performed according to the afore-described approach of the invention only once in steps a and b. In practice this may take about one minute. However, the set of MR signals acquired in step b), i.e. by means of the absolute field mapping sequence, is insufficient to determine the spatial transmit sensitivity profiles of the RF antennas in the array. The relative $B_1$-maps can be obtained in steps c and d very quickly. The corresponding imaging sequence can be applied at a low resolution (voxel size>10 mm$^3$) so that steps c and d will require not more than a couple of seconds in practice. Typically, steps c and d are repeated as many times as there are RF antennas in the array in order to obtain a relative $B_1$-map for each RF antenna. The absolute $B_1$-maps are finally obtained for the individual RF antennas by comparing the relative $B_1$-maps to the absolute $B_1$-map determined in steps a and b.

Preferably, the RF pulses applied in the absolute field mapping sequence and in the relative field mapping sequence have the same temporal wave form. This facilitates the determination of the spatial transmit sensitivity profiles of the RF antennas from the spatial RF field distribution derived in step b and from the relative maps derived in step d.

The invention not only relates to a MR apparatus, but also to a MR method comprising the following steps:

subjecting a body of a patient placed within an examination volume of a magnetic resonance apparatus to an imaging sequence comprising RF pulses, wherein the RF pulses are generated via an array of RF antennas having spatial transmit and receive sensitivity profiles, the phase and the amplitude of the RF feeding of each individual RF antenna being controlled for the purpose of RF shimming, wherein the phases and amplitudes are determined from the spatial transmit sensitivity profiles of the RF antennas, acquiring MR signals from a body of a patient via the RF antennas, reconstructing a MR image from a combination of the acquired MR signals received via the individual RF antennas and from the spatial receive sensitivity profiles of the RF antennas. In case the spatial receive sensitivity profiles of the RF antennas are known, the invention proposes to determine the spatial transmit sensitivity profiles of the RF antennas are from the known spatial receive sensitivity profiles of the RF antennas. In case the spatial transmit sensitivity profiles of the RF antennas are known, the invention proposes to determine the spatial receive sensitivity profiles of the RF antennas from the known spatial transmit sensitivity profiles of the RF antennas.

The MR imaging techniques of the invention described thus far can be carried out by means of a MR apparatus including at least one main magnet coil for generating a uniform steady magnetic field within an examination volume, a number of gradient coils for generating switched magnetic field gradients in different spatial directions within the examination volume, an array of two or more RF antennas for transmitting RF pulses to and receiving MR signals from a body of a patient positioned in the examination volume, a control unit for controlling the temporal succession of RF pulses and switched magnetic field gradients, and a reconstruction unit for reconstructing a MR image from the MR signals. The method of the invention may be implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

Figure 2:
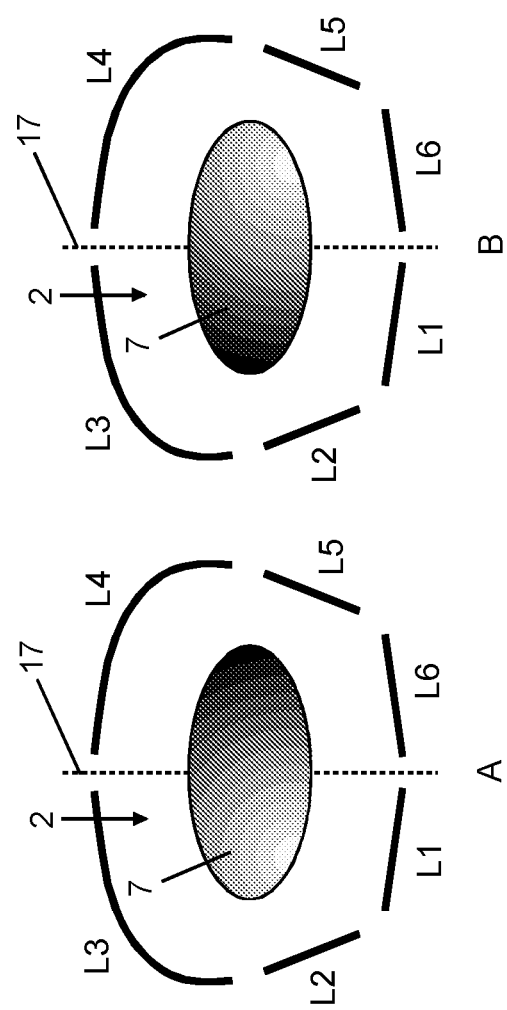

The enclosed drawings disclose preferred embodiments of the present invention. It should be understood, however, that the drawings are designed for the purpose of illustration only and not as a definition of the limits of the invention. In the drawings:

FIG. 1 shows a MR apparatus according to the invention;

FIG. 2 schematically illustrates the symmetry of the transmit and receive sensitivity profiles of the RF antennas made use of according to the invention.

With reference to FIG. 1, a MR device 1 is shown. The device comprises superconducting or resistive main magnet coils (not shown) such that a substantially uniform, temporally constant main magnetic field is created along a z-axis through an examination volume 2.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume 2. A body 7 of a patient is located on a patient table 8. The generation of RF fields takes place by means of eight RF antennas 9, which are arranged around the examination volume 2 and which comprise conductor elements running parallel with the longitudinal axis (z-axis) of the main field magnet. The RF antennas 9 form an array in the MR apparatus 1 shown in FIG. 1, which, in addition to exciting MR signals in the examination volume 2, is also used for their reception. Provision is made for a RF screen 10, which encloses the entire examination volume 2. Each of the eight RF antennas 9 shown in FIG. 1 is connected to a terminal designated by lower-case letters a to h. The input/output terminals of a RF distribution unit 11 provided with corresponding letters are assigned to terminals a to h. In this way, one channel of the RF distribution unit 11 is assigned to each of the RF antennas 9. A RF transmitter 12 transmits RF pulses or pulse packets, via the RF distribution unit 11, to the RF antennas 9 to transmit RF pulses into the examination volume 2. A typical imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of the body 7 positioned in the examination volume 2. The RF distribution unit 11 comprises a controllable multiplexer/distributor network enabling the output signals of the transmitter 12 to be distributed over the channels a to h. The RF distribution unit 11 is controlled by a host computer 13. The amplitudes and phases of the RF feeding via the channels a to h are individually controllable by means of the host computer 13 for the purpose of RF shimming.

The host computer 13 controls the gradient pulse amplifier 3, RF distribution unit 11, and the transmitter 12 to generate any of a plurality of imaging sequences, such as echo planar imaging (EPI), echo volume imaging, gradient and spin echo imaging, fast spin echo imaging, and the like.

The resultant MR signals are picked up by the RF antennas 9. For this purpose, each channel a to h of the RF distribution unit 11 is equipped with a sensitive preamplifier and a demodulator. For the selected sequence, a single or a plurality of MR data lines in rapid succession following each RF excitation pulse. A data acquisition system 14 performs analog-to-digital conversion of the received signals and converts each MR data line to a digital format suitable for further processing.

Ultimately, the digital raw image data is reconstructed into an image representation by a reconstruction processor 15 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 16 which provides a man-readable display of the resultant MR image.

The host computer 13 and the reconstruction processor 15 comprise a programming by which they are enabled to execute the above-described MR imaging method of the invention.

FIG. 2 schematically shows a cross-sectional view of an embodiment, in which six RF antennas L1, L2, L3, L4, L5, L6 of an array are arranged around the body 7 of the patient. The RF antennas are not identical in size and form. For example, RF antenna L3 is curved and much larger than RF antenna L1. However, the RF antennas L1, L2, L3, L4, L5, L6 are symmetrically arranged with respect to a mid-sagittal plane 17 of the body 7. For example, RF antennas L3 and L4 are of identical size and constitute each other's mirror image RF antenna. The shaded pattern in FIG. 2A represents the spatial transmit sensitivity profile (B1-map) of RF antenna L2. The shaded pattern in FIG. 2B represents the spatial receive sensitivity profile of RF antenna L5, which is the mirror image RF antenna of RF antenna L2. The receive sensitivity profile of RF antenna L5 is the mirror image of the transmit sensitivity profile of RF antenna L2, and vice versa. Consequently, the B1-map of RF antenna L2 can be determined from the receive sensitivity profile of RF antenna L5 in accordance with the invention.

According to the invention, MR imaging is performed by subjecting the body 7 placed within the examination volume 2 to an imaging sequence comprising RF pulses, wherein the RF pulses are generated via the array of RF antennas L1, L2, L3, L4, L5, L6. The phase and the amplitude of the RF feeding of each individual RF antenna is controlled for the purpose of RF shimming. The phases and amplitudes can be represented as a set of complex weighting factors W1, W2, W3, W4, W5, W6 determining a linear superposition of the $B_1$ fields generated via the individual RF antennas L1, L2, L3, L4, L5, L6. The resultant MR signals are received from the body 7 via the RF antennas L1, L2, L3, L4, L5, L6 as well. Finally, a MR image is reconstructed from a combination of the acquired MR signals. For this purpose, the spatial receive sensitivity profiles of the RF antennas L1, L2, L3, L4, L5, L6 are determined from the transmit sensitivity profiles by exploiting the above-described symmetry properties. This is achieved in the depicted embodiment of the invention simply by linearly superimposing the MR signals, wherein the above weighting factors are applied in a mirror inverted manner. The following complex weighting factors are applied to the individual channels as 'transmit shim settings' and 'receive shim settings' respectively in order to obtain a homogeneous total transmit and receive sensitivity:

| RF antenna | Shim settings Transmit | Receive |
|---|---|---|
| L1 | W1 | W6 |
| L2 | W2 | W5 |
| L3 | W3 | W4 |
| L4 | W4 | W3 |
| L5 | W5 | W2 |
| L6 | W6 | W1 |

This scheme of transmit/receive shimming is applicable under the provision that a corresponding symmetry exists. A further pre-requisite is that all attenuations and delays of the respective RF antennas are well-defined or, preferably, equal. These pre-requisite will often be met in practice. For example, a quadrature body coil having two feed points can be regarded as a two-channel array of RF antennas within the meaning of the invention, which is symmetric with respect to the mid-sagittal plane of the body of the examined patient.

When the weighting factors are derived for the combination of the received MR signals as described for the purpose of receive shimming, the total transmit sensitivity profile is the mirror inverted receive sensitivity profile of the whole array. In the case that the homogeneity is not optimized for the whole examination volume by means of transmit shimming, but only for a section, for example the left half of the examination volume, the receive shim settings must be derived from the transmit shim settings that optimize the $B_1$ homogeneity in the corresponding mirror inverted section, i.e. in the right half of the examination volume in the example.

According to the invention, the complete transmit and receive sensitivity profiles of the arrangement shown in FIG. 2 can be determined as follows:

At first, the body 7 is subjected to an absolute field mapping sequence comprising RF pulses that are generated by using a first set of phases and amplitudes of the RF feeding of the RF antennas. This first set of phases and amplitudes is selected such that all RF antennas L1, L2, L3, L4, L5, L6 are transmitting simultaneously. The dual-TR approach proposed by Yarnykh et al. (see above) can be used for this purpose. The resulting $B_1$-map is designated as $B_1(\vec{x})$. As a next step, the body 7 is subjected to an imaging sequence constituting a relative field mapping sequence within the meaning of the invention, the imaging sequence comprising RF pulses that are generated by using a second set of phases and amplitudes, which is also selected such that all RF antennas L1, L2, L3, L4, L5, L6 are transmitting simultaneously. From the received MR signals, individual MR images $m_j(\vec{x})$ are reconstructed for each channel j (j=1 . . . 6). A fast three-dimensional field-echo imaging sequence is used for acquisition of the MR images $m_j(\vec{x})$ with a low flip-angle (<5°, preferably 1°) and a very short repetition time (<10 ms, preferably 1 ms) at a low resolution. The acquisition of the MR images thus takes only some seconds. From the individual images $m_j(\vec{x})$, a sum image is calculated:

$$m(\vec{x}) = \sum_j m_j(\vec{x}).$$

From this, relative receive sensitivity profiles can be estimated as: $m_j(\vec{x})/m(\vec{x})$. Using the symmetry properties of the arrangement, relative transmit sensitivity profiles can be estimated as: $m_{mirr(j)}(mirr(\vec{x}))/m(mirr(\vec{x}))$, wherein mirr(j) stands for the index of the mirror image RF antenna associated with RF antenna of channel j and mirr($\vec{x}$) stands for the mirror inverted position with respect to position $\vec{x}$. These relative transmit sensitivity profiles reflect the relative map of the spatial distribution of the RF field transmitted during the relative field mapping sequence. The absolute transmit sensitivity profile, i.e. the $B_1$-map of RF antenna j is then obtained by multiplying the respective relative transmit sensitivity profile by $B_1(\vec{x})$. Similarly, the absolute receive sensitivity profile is obtained by multiplying the respective relative receive sensitivity profile by $B_1(\vec{x})$. In this way, one single full $B_1$-mapping scan in combination with one fast imaging step yields the full spatial transmit and receive sensitivity profiles of the individual RF antennas.

The invention claimed is:

1. A magnetic resonance imaging apparatus comprising an array of two or more RF antennas for transmitting RF pulses to and receiving received MR signals from a body of a patient positioned in an examination volume, the two or more RF antennas having spatial transmit sensitivity profiles and receive sensitivity profiles, wherein the magnetic resonance imaging apparatus is configured to:
 control a temporal succession, phases and amplitudes of RF feeding of each individual RF antenna, the phases and amplitudes being determined from the spatial transmit sensitivity profiles of the two or more RF antennas;
 reconstruct a MR image from a combination of the received MR signals received via the individual RF antennas and from the spatial receive sensitivity profiles of the two or more RF antennas;
 subject the body to a single absolute field mapping sequence comprising RF pulses that are generated by using a first set of phases and amplitudes of the RF feeding of the two or more RF antennas;
 acquire acquired MR signals, from which a single absolute map of a spatial distribution of the RF field transmitted during the single absolute field mapping sequence is derived;
 subject the body to at least one relative field mapping sequence comprising RF pulses that are generated by using a second set of phases and amplitudes of the RF feeding of the two or more RF antennas;
 acquire acquired MR signals, from which a relative map of the spatial distribution of the RF field transmitted during the relative field mapping sequence is derived for each individual RF antenna of the two or more RF antennas resulting in a plurality of relative maps, wherein the relative map is a localized representation of an MR image at a respective RF antenna location;
 determine the spatial transmit sensitivity profiles of the two or more RF antennas from a combination of the single absolute map and from the plurality of relative maps; and
 determine the spatial receive sensitivity profiles of the two or more RF antennas from the spatial transmit sensitivity profiles of the two or more RF antennas.

2. The magnetic resonance imaging apparatus according to claim 1, wherein the magnetic resonance imaging apparatus is configured to determine the spatial transmit or receive sensitivity profiles of the two or more RF antennas by equating the spatial transmit and receive sensitivity profiles.

3. The magnetic resonance imaging apparatus according to claim 1, wherein the two or more RF antennas are symmetrically configured with respect to an axis or a plane of symmetry, wherein a mirror image RF antenna is attributed to each RF antenna of the array, and wherein the magnetic resonance imaging apparatus is
 configured to determine the spatial receive sensitivity profile of at least one RF antenna from the spatial transmit sensitivity profiles of the respective mirror image RF antenna.

4. The magnetic resonance imaging apparatus according to claim 3, wherein the body of the patient is essentially symmetric with respect to the axis or plane of symmetry of the array of two or more RF antennas.

5. A magnetic resonance imaging apparatus comprising an array of two or more RF antennas for transmitting RF pulses to and receiving MR signals from a body of a patient positioned in an examination volume, the two or more RF antennas having spatial transmit sensitivity profiles and receive sensitivity profiles, wherein the magnetic resonance imaging apparatus is configured to control a temporal succession, phases and amplitudes of RF feeding of each individual RF antenna,
 wherein the magnetic resonance imaging apparatus is further configured:
 a) subject the body to a single absolute field mapping sequence comprising RF pulses that are generated by using a first set of phases and amplitudes of the RF feeding of the two or more RF antennas,
 b) acquire acquired MR signals, from which a single absolute map of a spatial distribution of the RF field transmitted during the single absolute field mapping sequence is derived,
 c) subject the body to at least one relative field mapping sequence comprising RF pulses that are generated by using a second set of phases and amplitudes of the RF feeding of the two or more RF antennas,
 d) acquire acquired MR signals, from which a relative map of the spatial distribution of the RF field transmitted during the relative field mapping sequence is derived for each individual RF antenna of the two or more RF antennas resulting in a plurality of relative maps, wherein the relative map is a localized representation of an MR image at a respective RF antenna location,
 e) determine the spatial transmit sensitivity profile of the two or more RF antennas from a combination of the single absolute map and from the plurality of relative maps.

6. The magnetic resonance imaging apparatus according to claim 5, wherein the acquired MR signals from which the single absolute map is derived is insufficient to determine the spatial transmit sensitivity profiles of all RF antennas in the array.

7. The magnetic resonance apparatus according to claim 5, wherein the RF pulses applied in the absolute field mapping sequence and in the relative field mapping sequence have a same temporal waveform.

8. The magnetic resonance apparatus according to claim 5, wherein the absolute field mapping sequence and the relative field mapping sequence are applied at a low spatial resolution.

9. A method of magnetic resonance imaging comprising the acts of:
   subjecting a body of a patient placed within an examination volume of a magnetic resonance apparatus to an imaging sequence comprising RF pulses, wherein the RF pulses are generated via an array of two or more RF antennas having spatial transmit sensitivity profiles and receive sensitivity profiles, a phase and an amplitude of RF feeding of each individual RF antenna of the two or more RF antennas being controlled, wherein the phases and amplitudes are determined from the spatial transmit sensitivity profiles of the two or more RF antennas;
   acquiring acquired MR signals from a body of a patient via the RF antennas,
   reconstructing a MR image from a combination of the acquired MR signals received via the individual RF antennas and from the spatial receive sensitivity profiles of the two or more RF antennas;
   subjecting the body to a single absolute field mapping sequence comprising RF pulses that are generated by using a first set of phases and amplitudes of the RF feeding of the two or more RF antennas;
   acquiring acquired MR signals, from which a single absolute map of a spatial distribution of the RF field transmitted during the single absolute field mapping sequence is derived;
   subjecting the body to at least one relative field mapping sequence comprising RF pulses that are generated by using a second set of phases and amplitudes of the RF feeding of the two or more RF antennas;
   acquiring acquired MR signals, from which a relative map of the spatial distribution of the RF field transmitted during the relative field mapping sequence is derived for each individual RF antenna of the two or more RF antennas resulting in a plurality of relative maps, wherein the relative map is a localized representation of an MR image at a respective RF antenna location;
   determining a spatial transmit sensitivity profile of at least one of the individual RF antenna from a combination of the single absolute map and from the plurality of relative maps; and
   determining the spatial receive sensitivity profiles of the RF antennas from the spatial transmit sensitivity profiles of the RF antennas.

10. A method of magnetic resonance imaging comprising the acts of:
   a) subjecting a body of a patient placed within an examination volume of a magnetic resonance apparatus to single absolute field mapping sequence comprising RF pulses that are generated via an array of two or more RF antennas having spatial receive sensitivity transmit and receive sensitivity profiles, wherein a first set of phases and amplitudes of RF feeding of each individual RF antenna of the two or more RF antennas is used;
   b) acquiring acquired MR signals, from which a single absolute map of a spatial distribution of the RF field transmitted during the single absolute field mapping sequence is derived;
   c) subjecting the body to at least one relative field mapping sequence comprising RF pulses that are generated by using a second set of phases and amplitudes of the RF feeding of the two or more RF antennas;
   d) acquiring acquired MR signals, from which a relative map of the spatial distribution of the RF field transmitted during the relative field mapping sequence is derived, or each individual RF antenna of the two or more RF antennas resulting in a plurality of relative maps, wherein the relative map is a localized representation of an MR image at a respective RF antenna location;
   e) determining the spatial transmit sensitivity profile of at least one of the individual RF antenna from a combination of the single absolute map determined in act b) and from the plurality of relative maps derived in act d).

11. The method of claim 10, wherein the relative field mapping sequence is a three-dimensional field-echo imaging sequence comprising RF pulses having a flip-angle of less than 5°, a repetition time of the three-dimensional field-echo imaging sequence being shorter than 10 ms, and the voxel size being larger than 10 mm$^3$.

12. A non-transitory computer readable medium for a magnetic resonance imaging apparatus comprising computer instructions which, when executed by a processor, configure the processor to perform the acts of:
   generating an imaging sequence comprising RF pulses, wherein phases and amplitudes of RF feeding of two or more RF antennas are controlled, the phases and amplitudes being determined from spatial transmit sensitivity profiles of the two or more RF antennas;
   reconstructing a MR image from a combination of MR signals received via the two or more RF antennas and from spatial receive sensitivity profiles of the two or more RF antennas;
   generating a single absolute field mapping sequence comprising RF pulses that are generated via an array of two or more RF antennas having spatial transmit sensitivity profiles and receive sensitivity profiles using a first set of phases and amplitudes of the RF feeding of each individual RF antenna of the two or more RF antennas;
   acquiring acquired MR signals, from which a single absolute map of a spatial distribution of the RF field transmitted during the single absolute field mapping sequence is derived;
   subjecting the body to at least one relative field mapping sequence comprising RF pulses that are generated by using a second set of phases and amplitudes of the RF feeding of the two or more RF antennas,
   acquiring acquired MR signals, from which a relative map of the spatial distribution of the RF field transmitted during the relative field mapping sequence is derived for each individual RF antenna of the two or more RF antennas resulting in a plurality of relative maps, wherein the relative map is a localized representation of an MR image at a respective RF antenna location;
   determining the spatial transmit sensitivity profile of the two or more RF antennas from a combination of the single absolute map and from the plurality of relative maps; and
   determining the spatial receive sensitivity profiles of the two or more RF antennas from the spatial transmit sensitivity profiles of the two or more RF antennas.

13. A non-transitory computer readable medium for a magnetic resonance imaging apparatus comprising computer instructions which, when executed by a processor, configure the processor to perform the acts of:
  a) generating a single absolute field mapping sequence comprising RF pulses that are transmitted via an array of two or more RF antennas having spatial transmit sensitivity profiles and receive sensitivity profiles using a first set of phases and amplitudes of RF feeding of each individual RF antenna of the two or more RF antennas;
  b) acquiring acquired MR signals, from which a single absolute map of spatial distribution of the RF field transmitted during the single absolute field mapping sequence is derived;
  c) generating at least one relative field mapping sequence comprising RF pulses that are transmitted by using a second set of phases and amplitudes of the RF feeding of the RF antennas of the two or more RF antennas resulting in a plurality of relative maps;
  d) acquiring acquired MR signals, from which a relative map of the spatial distribution of the RF field transmitted during the relative field mapping sequence is derived for an individual RF antenna of the two or more RF antennas; and
  e) determining a spatial transmit sensitivity profile of at least one individual RF antenna of the two or more RF antennas from a combination of the single absolute map determined in act b) and from the plurality of relative maps derived in act d).

\* \* \* \* \*